(12) United States Patent
Cok

(10) Patent No.: US 7,133,032 B2
(45) Date of Patent: Nov. 7, 2006

(54) OLED DISPLAY AND TOUCH SCREEN

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 402 days.

(21) Appl. No.: 10/422,458

(22) Filed: Apr. 24, 2003

(65) Prior Publication Data

US 2004/0212603 A1 Oct. 28, 2004

(51) Int. Cl.
*G09G 5/00* (2006.01)

(52) U.S. Cl. .................................... 345/175
(58) Field of Classification Search ............ 345/156, 345/157, 173–178, 179, 76–83, 60; 178/18.09, 178/19.01, 18.01, 18.03
See application file for complete search history.

(56) References Cited

U.S. PATENT DOCUMENTS

| | | | |
|---|---|---|---|
| 4,916,308 A * | 4/1990 | Meadows | 250/221 |
| 6,172,459 B1 | 1/2001 | Hung et al. | |
| 6,762,747 B1 * | 7/2004 | Fujioka et al. | 345/157 |
| 6,846,579 B1 * | 1/2005 | Anderson et al. | 428/690 |
| 6,879,319 B1 * | 4/2005 | Cok | 345/173 |
| 2003/0150714 A1 * | 8/2003 | Cropper et al. | 204/192.29 |
| 2004/0090426 A1 * | 5/2004 | Bourdelais et al. | 345/173 |
| 2004/0140960 A1 * | 7/2004 | Cok | 345/175 |
| 2004/0140961 A1 * | 7/2004 | Cok | 345/175 |

OTHER PUBLICATIONS

Corzine et al., Design of Fabry-Perot Surface-Emitting Lasers with a Periodic Gain Structure, *IEEE Journal of Quantum Electronics*, vol. 25, No. 6, Jun. 1989, pp. 1513-1524.

* cited by examiner

*Primary Examiner*—Amare Mengistu
(74) *Attorney, Agent, or Firm*—Andrew J. Anderson; Thomas H. Close

(57) ABSTRACT

An OLED display and touch screen system includes a substrate; an OLED display including an array of individually addressable OLEDs formed on the substrate; and a touch screen including an OLED laser light emitter formed on the substrate, a light sensor formed on the substrate across the display from the light emitter, and optics located around the display above the light emitter and the light sensor for directing light emitted from the OLED laser light emitter across the display to the light sensor.

21 Claims, 6 Drawing Sheets

OLED DISPLAY AND TOUCH SCREEN

FIELD OF THE INVENTION

This invention relates generally to organic light emitting diode (OLED) displays and, more particularly, to an OLED display with a touch screen.

BACKGROUND OF THE INVENTION

Modern electronic devices provide an increasing amount of functionality with a decreasing size. By continually integrating more and more capabilities within electronic devices, costs are reduced and reliability increased. Touch screens are frequently used in combination with conventional soft displays such as cathode ray tubes (CRTs), liquid crystal displays (LCDs), plasma displays and electroluminescent displays. The touch screens are manufactured as separate devices and mechanically mated to the viewing surfaces of the displays.

US Patent Application Publication 2002/0175900 A1 by Armstrong, published Nov. 28, 2002, describes a touch system for use with an information display system including a frame defining an opening corresponding in size and shape to an information display area of a display. On each side is positioned an array of light emitting devices with a light-transmissive prism positioned along each array of light emitting devices such that light emitted from the light emitting devices is directed across the touch input area. The system also includes light detection devices positioned at each corner of the frame. In a preferred embodiment, the light emitting devices are organic light emitting diodes.

When such a touch screen is used with a flat-panel display, the touch screen is simply placed over the flat panel display and the two are held together by a mechanical mounting means such as an enclosure. These prior art arrangements combining touch screens and OLED displays suffer from a variety of drawbacks. The use of frames increases the parts count, weight, and cost of the device. The separation between the touch screen and display increases thickness. Redundant components found in the display and touch screen further increase cost and decrease performance as compared to more integrated solutions. Moreover, the need for separate cabling for the touch screen increases manufacturing costs.

Thus, there remains a need for an improved touch screen, flat panel display system that minimizes device weight, removes redundant materials, decreases cost, eliminates special mechanical mounting designs, increases reliability, and minimizes the degradation in image quality.

SUMMARY OF THE INVENTION

The need is met according to the present invention by providing an OLED display and touch screen system that includes a substrate; an OLED display including an array of individually addressable OLEDs formed on the substrate; and a touch screen including an OLED laser light emitter formed on the substrate, a light sensor formed on the substrate across the display from the light emitter, and optics located around the display above the light emitter and the light sensor for directing light emitted from the OLED laser light emitter across the display to the light sensor.

ADVANTAGES

The integrated display and touch screen according to the present invention is advantageous in that it provides a thin, light, easily manufacturable display having reduced weight, size, and cost and a greater reliability. The use of OLED laser light emitters according to the present invention provides an improved touch screen because the laser light is directed in highly directional beams across the display. Signal analysis is very straightforward since the interrupted beams of light define an intersection in a plane corresponding to the point of interruption, or touch. The highly directional beams of light are more power efficient than prior art touch screens employing incoherent light. The present system is also advantaged with respect to conventional optical touch screens in that such conventional systems are not highly integrated, have a higher physical profile, and relatively lower resolution.

DETAILED DESCRIPTION OF THE INVENTION

Figure 1:
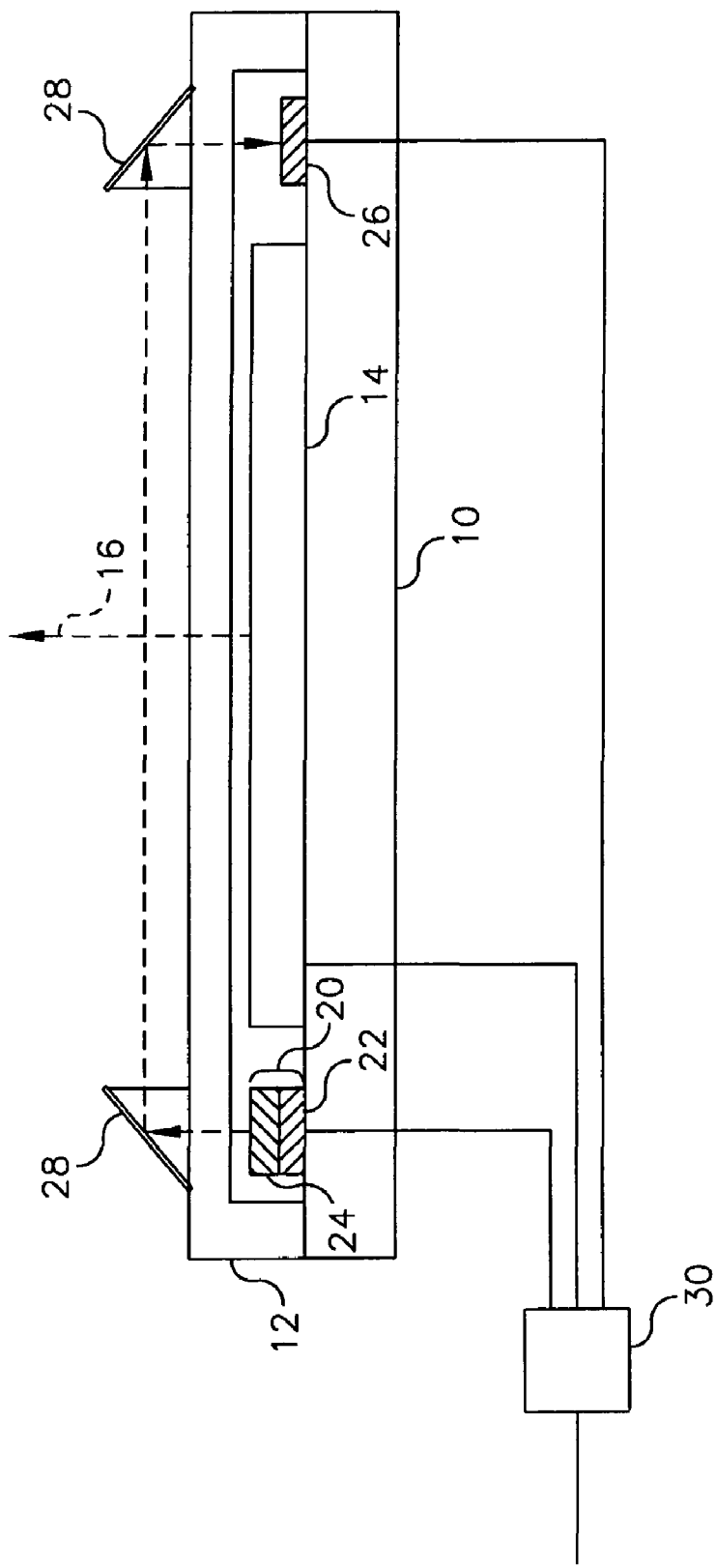
FIG. 1 is a schematic side view showing the basic structure of an integrated OLED display and touch screen according to the present invention.
Figure 2:
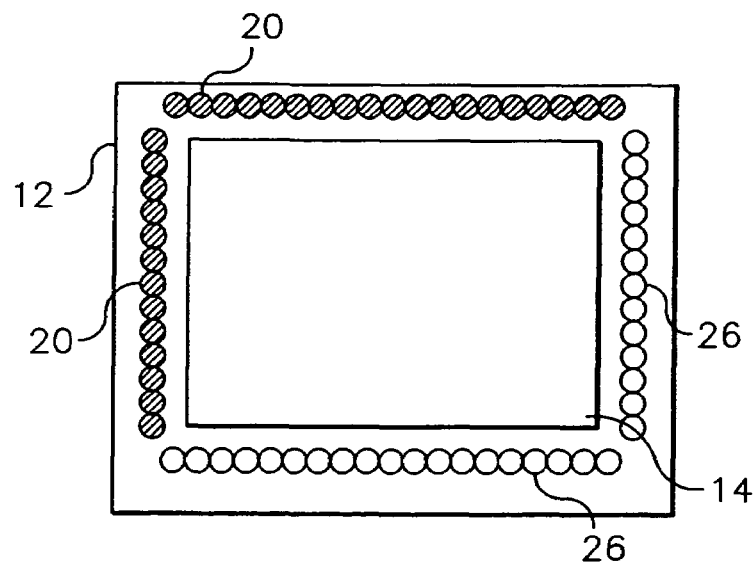
FIG. 2 is a schematic top view of the integrated OLED display and touch screen.
Figure 3:
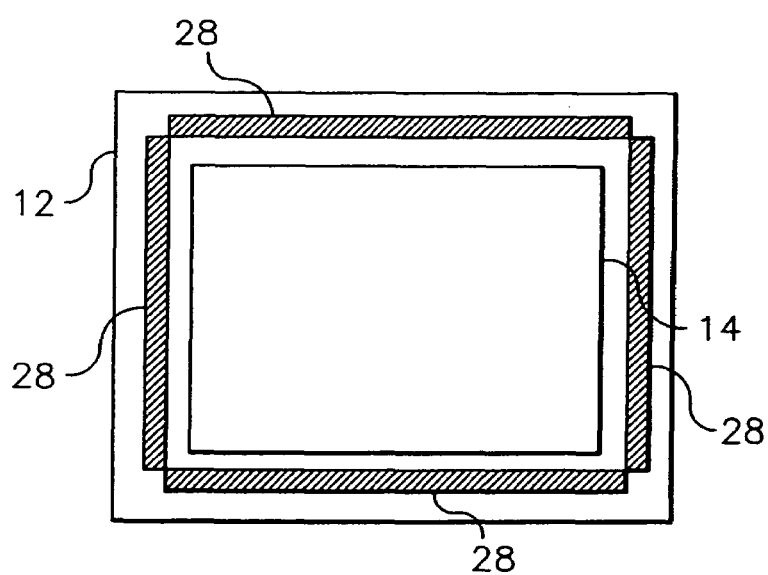
FIG. 3 is a schematic top view of an integrated OLED display and touch screen showing the location of the optics.

Referring to FIGS. 1–3, a top emitting OLED display device with an integrated optical touch screen according to one embodiment of the present invention includes a substrate 10 with an encapsulating cover 12. Located on the substrate is an OLED display 14 including electrodes and multiple layers of materials such as hole-injection layers and electron transport layers (not shown) as is well known in the art. Light 16 emitted from the display passes directly through the encapsulating cover 12 or is reflected from the substrate 10 and is emitted through the encapsulating cover 12. At one side of the OLED display 14 is an array of OLED laser light emitters 20 that include OLEDs 22 and organic lasers 24 positioned to be optically pumped by OLEDs 22. At the opposite side of the OLED display 14 is an array of complementary light sensors 26 to receive the light output from the OLED laser light emitters 20. The light sensors 26 may include filters (not shown) to improve their frequency response and filter out ambient light.

Coherent light from the OLED laser light emitters 20 is emitted orthogonally to the substrate 10. The light is redirected by optics 28 that redirects the collimated light across the face of the display and back down to the light sensors 26. As shown in the top view of FIG. 2, a second pair of emitter and sensor arrays are arranged on the other two sides of the OLED display 14.

According to the present invention, the OLED laser light emitters 20 and sensors 26 are integrated on the same substrate 10 as the OLED display 14. Optics 28, such as mirrors, are arranged over the encapsulating cover 12 directly above the emitter and sensor arrays for directing light emitted from the OLED laser light emitters 20 across the display to the light sensors 26. The optics 28 may be constructed using glass or plastic prisms with a reflective side arranged at approximately 45 degrees to the cover 12. Alternatively, the optics can be mirrors that are supported at approximately 45 degree angles with respect to the cover 12. An integrated touch screen and display controller 30 is electrically connected to the touch screen and the display. The integrated touch screen/display controller 30 may be formed on substrate 10 or provided as an external integrated circuit.

Figure 4:
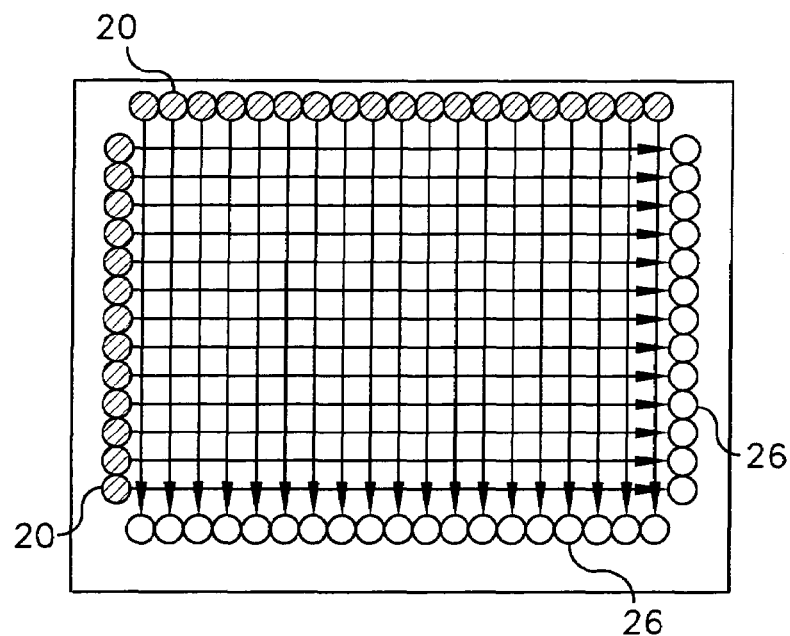
FIG. 4 is a top view showing the propagation of light over the surface of the OLED display.
Figure 5:
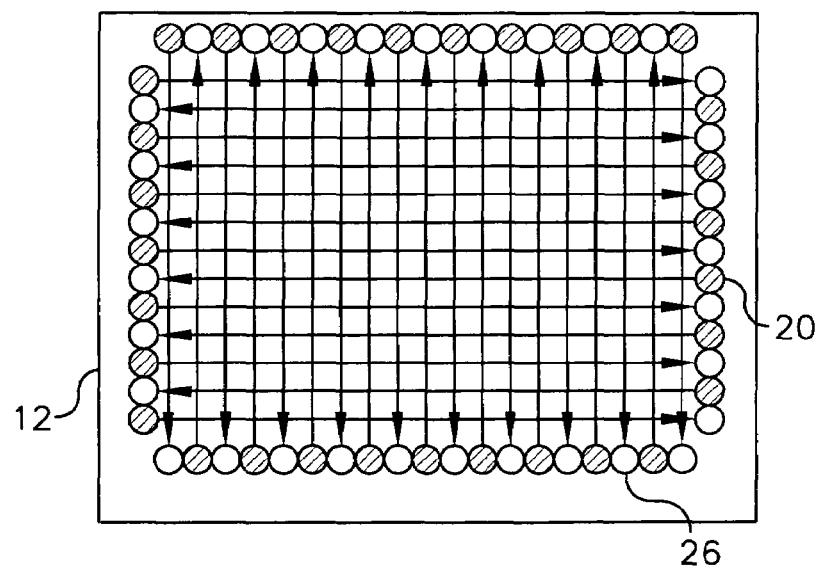
FIG. 5 is a top view showing the propagation of light over the surface of the OLED display according to an alternative embodiment.

Referring to FIG. 3, the optics 28 are arranged to complement the OLED laser light emitters 20 and sensors 26 on each side of the display 14. The OLED laser light emitters 20 are located in two arrays adjacent two contiguous edges of the display 14 and the sensors 26 are located in two arrays adjacent the other two edges of the display 14. Light is emitted from the emitters, directed across the face of the display and down to the sensors. Referring to FIG. 4, the path of the light is shown from each emitter to the associated sensor in parallel rows in each direction. Alternatively, as shown in FIG. 5 the OLED laser light emitters 20 and sensors 26 may be interdigitated in arrays surrounding the display 14.

In operation, OLEDs 22 emit incoherent light in every direction. This light is used to optically pump the organic lasers 24 located on the OLEDs 22. Coherent laser light is emitted from the organic lasers orthogonally to the display substrate 10, directed by the optics 28 located above the OLED laser light emitters 20 and passes over the surface of the OLED display 14. After passing over the surface of the OLED display, the light is directed by the optics 28 to the sensors 26. The sensors 26 detect the light and produce feedback signals that are supplied to the touch screen controller 30 and interpreted in a conventional manner to locate the position of an object that interrupts the light from the OLED laser light emitters 20. Because the touch screen elements are integrated on a common substrate with the display, a single connector may be used to connect both the touchscreen and the display to an integrated touch screen/display controller.

The OLED laser light emitters 20 may be energized sequentially to provide multiple signals thereby increasing the signal-to-noise ratio of the feedback signal and providing a more detailed map of any touching implement that inhibits the transmission of the light. Alternatively, the emitters may be energized simultaneously. Ideally, each sensor will detect light from only one emitter, however, in practice, the OLED laser light emitters 20 may emit some incoherent light which can be detected by more than one sensor.

Figure 6:
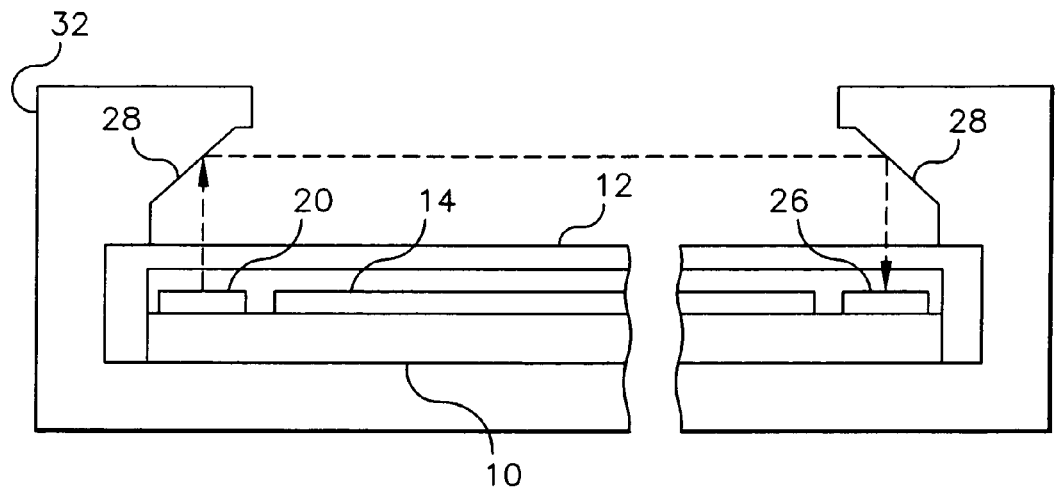
FIG. 6 is a schematic side view of an integrated OLED display and touch screen wherein the optics are part of an enclosure for the display.
Figure 7:
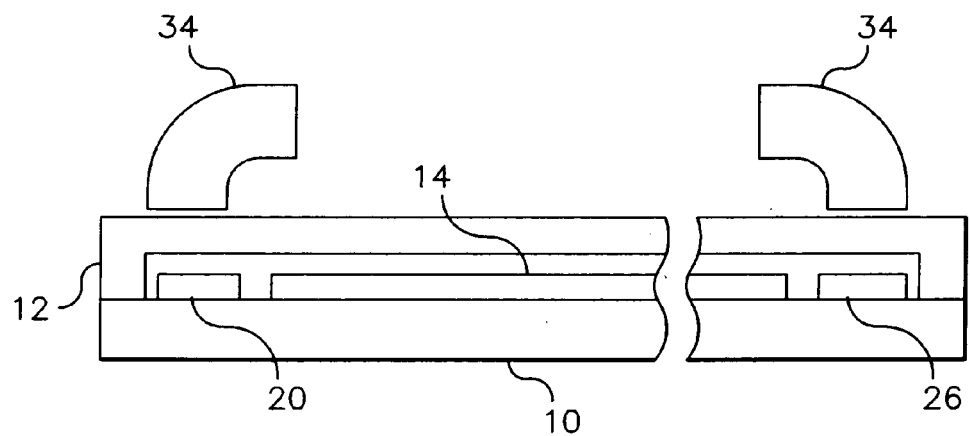
FIG. 7 is a schematic side view showing light pipes used for the optics.

Referring to FIG. 6, the optics 28 may be formed by a reflective surface on an enclosure 32 enclosing the integrated display and touchscreen. Referring to FIG. 7, the optics for directing light emitted from the OLED laser light emitter 20 across the display to the light sensor 26 may comprise light pipes 34. A variety of optical structures can be employed as well as mirrors and light pipes. For example, the optical elements may include refractive lenses, such as cylindrical lenses, reflective lenses, such as parabolic mirrors, or holographic elements to improve the performance of the light transmission and detection. In a specific embodiment, the optics may be fiber optics. Because the present invention does not require a separate frame or substrate for the touchscreen, it reduces the weight, size (thickness), and cost of a combined touchscreen and OLED display device.

Figure 8:
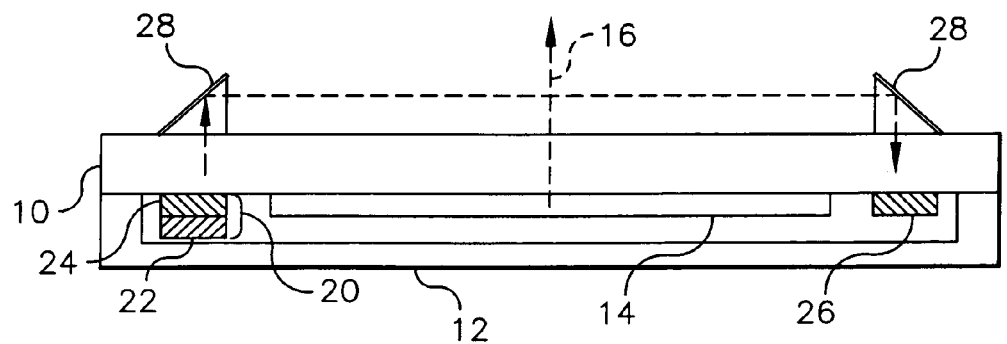
FIG. 8 is a schematic side view of an integrated bottom emitting OLED display and touch screen according to the present invention.

Referring to FIG. 8, a bottom emitting OLED display device with an integrated optical touch screen according to another embodiment of the present invention includes a substrate 10 with an encapsulating cover 12. Located on the substrate is an OLED display 14 including electrodes and multiple layers of materials such as organic light emitting layers, hole-injection layers, hole-transport layers, and electron transport layers (not shown) as is well known in the art. Light 16 emitted from the display passes directly through the substrate 10 or is reflected from the encapsulating cover 12 and passes through the substrate 10. The encapsulating cover 12 may be a glass, metal, or a coated polymeric layer.

Figure 9:
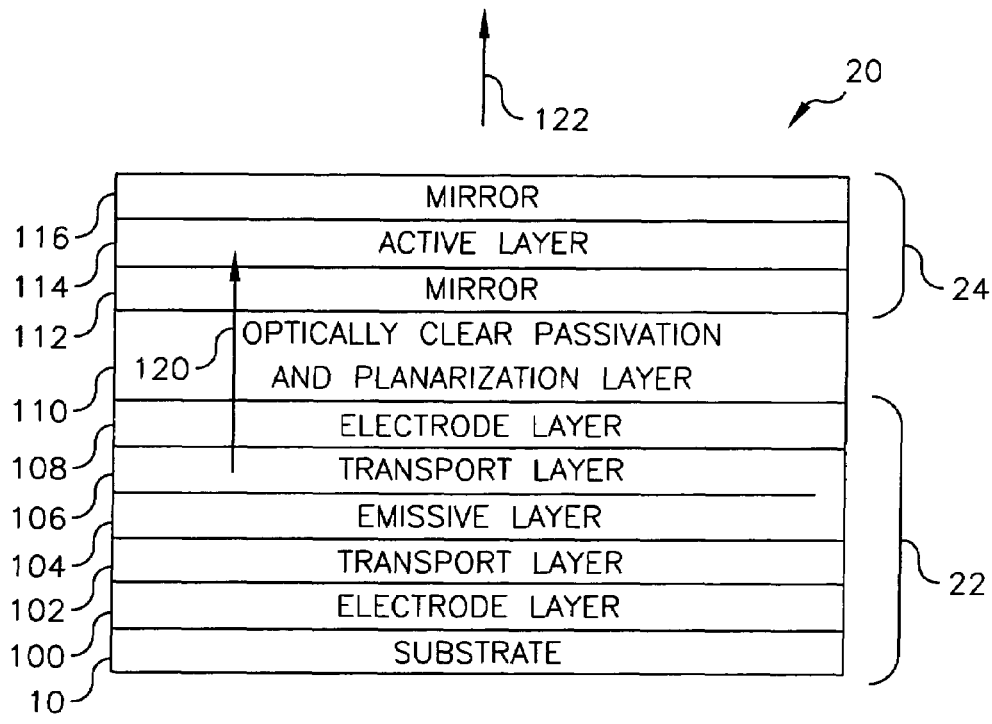
FIG. 9 is a schematic cross section view of an electrically pumped organic solid state laser apparatus useful with the present invention.

Referring to FIG. 9, a schematic cross section of an electrically pumped organic solid state light emitters 20 useful with the present invention includes two sections. The organic laser 24 is a vertical laser cavity which differs from the prior art in that an optically transparent layer 110 is located between an OLEDs 22 and the organic laser 24, and both reflectors 112 and 116 are DBR mirrors and the active layer 114 is formed from organics which employ a host-dopant material system. In the preferred embodiment, layer 110 is an optically transparent insulating planarization layer compatible with an OLED incoherent light source, for example silicon dioxide; however, it can be any optically flat layer compatible with an OLED incoherent light source and upon which a DBR mirror can be grown. A DBR mirror 112 is deposited on the transparent planarization layer 110. It is preferred to be grown by conventional sputtering or electron-beam (e-beam) deposition since it is important to get accurate thicknesses for the dielectric layers. The bottom DBR mirror 112 is composed of alternating high and low refractive index dielectric layers, such that, at the wavelength for the laser light 122 its reflectivity is greater than 99.9% and it transmits greater than 90% of the OLED light 120. DBR mirror 112 is composed of $\lambda/4$-thick alternating high and low refractive index dielectric layers in order to get a high-reflectance at the lasing wavelength, $\lambda_1$; additional alternating high and low refractive index dielectric layers are also deposited such that there results a broad transmission maximum for the OLED light 120. Over the DBR mirror 112 is deposited the organic active layer 114, which can be formed by conventional high-vacuum ($10^{-7}$ Torr) thermal vapor deposition or by spin casting from solution. In order to obtain low thresholds, it is preferred that the thickness of the active layer 114 be integer multiples of $\lambda/2$, where $\lambda$ is the lasing wavelength. The lowest thresholds are obtained for the integer multiple being either 1 or 2. The active layer 114 comprises host and dopant organic molecules. It is preferred that the organic molecules be of small molecular weight since currently they can be deposited more uniformly. The host materials used in the present invention are selected from any materials that have sufficient absorption of the OLED light 120 and are able to transfer a large percentage of their excitation energy to a dopant material via Forster energy transfer. Those skilled in the art are familiar with the concept of Forster energy transfer, which involves a radiationless transfer of energy between the host and dopant molecules. An example of a useful host-dopant combination for red-emitting lasers is aluminum tris(8-hydroxyquinoline) (Alq) as the host and 4-(dicyanomethylene)-2-t-butyl-6-(1, 1,7,7-tetramethyljulolidyl-9-enyl)-4H-pyran (DCJTB) as the red-emitting dopant. A DBR mirror 116 is deposited over the active layer 114. It is also deposited by conventional e-beam deposition; however, this time it is preferred that during the deposition process the temperature of the organic stay below 75 C. The top DBR mirror 116 is composed of alternating high and low refractive index dielectric layers, such that, at the wavelength for the laser light 122 its reflectivity is greater than 98% and it reflects greater than 90% of the OLED light 120. Consequently, besides depositing the $\lambda/4$-thick alternating high and low refractive index dielectric layers (where $\lambda$ is chosen near the desired lasing wavelength), additional alternating high and low refractive index dielectric layers are deposited such that there results a broad reflection maximum for the OLED light 120. In particular, it is only necessary to reflect that portion of the OLED light 120 which is absorbed by the active layer 114 host material.

The OLEDs 22 of the organic solid-state laser emitters 20 is one or more electrically driven organic light emitting diode devices which produce incoherent light within a predetermined portion of the spectrum. For an example of an OLED device, see commonly assigned U.S. Pat. No. 6,172,459 B1 issued Jan. 9, 2001 to Hung et al., and the references cited therein, the disclosures of which are incorporated by reference.

The OLED 22 is formed adjacent to, and preferably on, a substrate 10 on which is formed an electrode 100, for example a hole injecting anode. The substrate 10 can be any material suitable for the construction of OLED devices as are described in the art, for example glass or quartz, and the electrode 100 can be a thin layer of indium tin oxide (ITO) or thin layers of conductive metals formed over the substrate 10. The electrode can be deposited by evaporation, sputtering, and chemical vapor deposition. An organic hole transport layer 102 is formed over the electrode 100, an organic light emitting layer 104 is formed over the hole transport layer 102, and an organic electron transport layer 106 is formed over the emitting layer 104. As an example for these three layers, a useful structure includes a diamine layer, such as, 4,4'-bis[N-(1-naphthyl)-N-phenylamino]biphenyl (NPB) for the hole-transport layer 102, undoped 9,10-Bis(2-naphthalenyl)anthracene (ADN) as the emitter layer 104, and Alq as the electron-transport layer 106. These organics are typically prepared by high-vacuum thermal evaporation. Their preferred thicknesses are 40–250 nm for the NPB, 10–50 nm for the ADN, and 10–200 nm for the Alq. A second electrode layer 108 (for example a cathode) is formed over the electron transport layer 106, and of a material selected to have a work function less than 4.0 eV. A suitable electrode layer 108 is indium tin oxide or MgAg, where the Mg—Ag volume ratio is 10:1. It can be formed by conventional thermal vapor deposition. An optically transmissive insulating planarization layer 110 is formed over the cathode and the organic laser 24 formed upon the layer 110. Additional layers, as are known in the art, can be included in the OLED structure, for example hole injection and electron injection layers. As is well understood in the art, a voltage V can be applied across the electrodes to provide the necessary electric field for causing the light emitting layer to produce the pump beam light, which is transmitted out of the organic light emitting diode device. The voltage V can be continuous or in the form of pulses.

Under typical bias conditions, electrons (negative charge carriers) will be injected from the electrode 108 into the organic electron-transport layer 106, and holes (positive charge carriers) will be injected from the electrode 100 into the organic hole transport layer 102. Electrons and holes are transported through the corresponding organic layers 106 and 102 and into the organic light emitting layer 104. In the organic light emitting layer 104 the electrons and holes mainly recombine near the junction between the hole transport layer 102 and the light emitting layer 104. The resulting recombination results in light emission from the organic light emitting layer 104. Of the light generated in the emitting layer, approximately 50% is directly emitted in the direction of the substrate 10 while the other 50% is emitted directly toward the electrode 108. The electrode 108 is transparent and allows the light to pass through the transparent insulating planarization layer 110 to optically pump the vertical laser. The electrode 100 and/or the underlying substrate can be made reflective so that the portion of the light emitted toward the substrate can be reflected out of the device to pass through the transparent insulating planarization layer as well. It is well known in the art that the positions of the anode and cathode and the hole and electron injecting and/or transport layers can be reversed so that, for example, electrode 100 is a cathode and electrode 108 is an anode. In this case, a reflective cathode can be deposited upon the substrate while the anode is transparent.

After exiting the OLED 22, the OLED light 120 enters the organic laser 24 through the bottom DBR mirror 112. As a result of the bottom DBR mirror design, the majority of that light passes into the active layer 114. By construction, the active layer host absorbs some fraction of the OLED light 120. Of the fraction of light which did not get absorbed (for cases where the active layer's absorption length is too small), the remaining fraction of light 120 enters the top DBR mirror layer 116, whereby a large fraction of the light is back-reflected into the active layer for a second pass. During the second pass, an additional fraction of the OLED light 120 is absorbed by the active layer host. Via the Forster energy transfer mechanism, the light energy absorbed by the host is non-radiatively transferred to the dopant molecules. It is preferred that the dopant molecule has a high quantum efficiency for emission since that results in the majority of the non-radiatively transferred energy being re-emitted as longer wavelength light. For example, with ADN as the OLED light emitter material, Alq as the active layer host, and DCJTB as the active layer dopant, the emitted OLED light is blue, Alq mainly absorbs in the blue, while DCJTB emits in the red. The organic laser 24 is designed to be a high-Q cavity for red light, especially for wavelengths where the top and bottom DBR mirrors have their highest reflectivities. Those skilled in the art are familiar with the concept that lasing occurs at a particular wavelength which has the highest net gain. At that wavelength, the laser light 122 reflects many times between the top and bottom DBR mirrors prior to being emitted mainly through the top DBR mirror 116 (since by design the mirror loss of the bottom DBR mirror is much lower than that of the top DBR mirror).

In this embodiment, the organic laser 24 and the electrically driven OLED 22 are combined in an integrated device formed on the substrate 10 with the electrically driven OLED 22 located on the substrate 10 and the organic laser 24 above the OLED 22 and separated from it by the optically transmissive layer insulating planarization layer 110. Consequently, the bottom DBR mirror 112 is composed of alternating high and low refractive index dielectric layers, such that, at the wavelength for the laser light 122 its reflectivity is greater than 99.9% and it transmits greater than 90% of the OLED light 120. Correspondingly, the top DBR mirror 116 is composed of alternating high and low refractive index dielectric layers, such that, at the wavelength for the laser light 122 its reflectivity is greater than 98% and it reflects greater than 90% of the OLED light 120.

Figure 10:
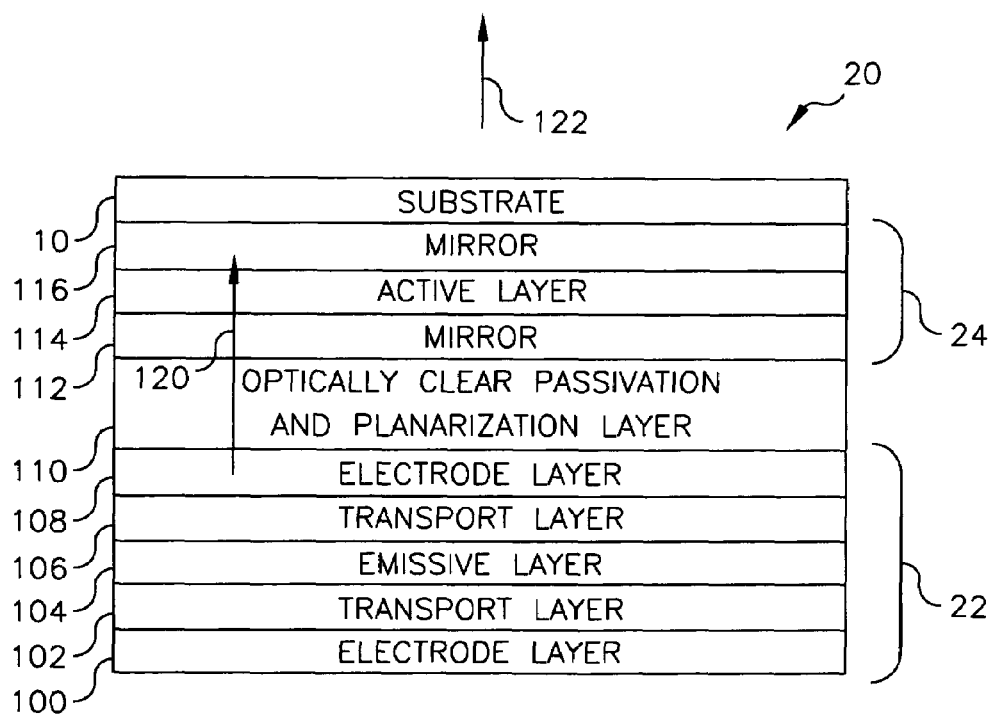
FIG. 10 is a schematic cross section view of an alternative arrangement of an electrically pumped organic solid state laser apparatus useful with the present invention.

Referring to FIG. 10, in an alternative embodiment of the present invention, the substrate 10 is transparent and is located adjacent to the organic laser 24, and preferably the organic laser 24 is formed upon the substrate 10, so that light is emitted through the substrate 10.

In either the embodiment shown in FIG. 9 or in FIG. 10, the integrated optically pumped laser light emitter 20 is formed upon a substrate 10 that also includes passive or active matrix circuitry providing means to operate and provide power to the integrated laser emitting apparatus. This circuitry is similar to that used for the OLED display 14. In this manner, an array of independently controlled laser emitters is formed on a common substrate with the OLED display 14.

Figure 11:
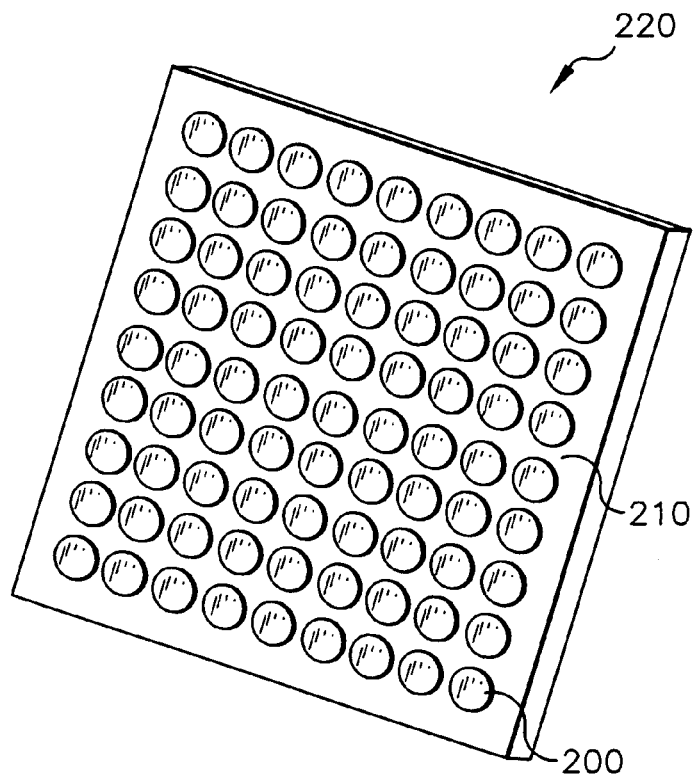
FIG. 11 is a top perspective view of a laser having multiple lasing elements.
Figure 12:
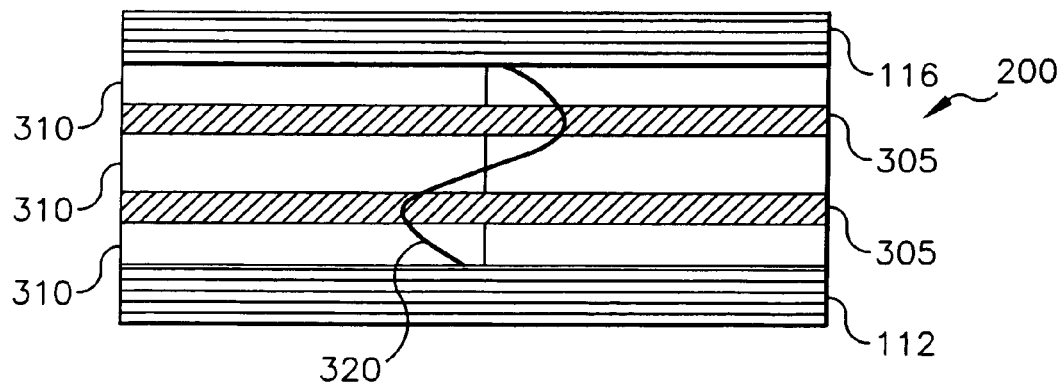
FIG. 12 is a cross sectional schematic view of a laser useful with the present invention.

The efficiency of the laser can be improved using an active region design as depicted in FIG. 11 for the vertical cavity organic laser structure. The organic active region includes one or more lasing elements 200. Referring to FIG. 12, periodic gain layers 305 are aligned with the antinodes of the device's standing wave electromagnetic field, where the laser's standing electromagnetic field pattern 320 in the lasing elements 200 is schematically shown. Since stimulated emission is highest at the antinodes and negligible at the nodes of the electromagnetic field, it is inherently advantageous to form the periodic gain layers 305 as shown in FIG. 12, separated by organic spacer layers 310. The organic spacer layers 310 do not undergo stimulated or spontaneous emission and largely do not absorb either the laser light 122 or the pump beam OLED light 120 wavelengths. An example of a material suitable for forming an organic spacer layer 310 is the organic material 1,1-Bis-(4-bis(4-methyl-phenyl)-amino-phenyl)-cyclohexane (TAPC).

TAPC works well as the spacer material since it largely does not absorb either the laser output or the pump beam energy and, in addition, its refractive index is slightly lower than that of most organic host materials. This refractive index difference is useful since it helps in maximizing the overlap between the electromagnetic field antinodes and the periodic gain layers 305. As will be discussed below with reference to the present invention, employing periodic gain region(s) instead of a bulk gain region results in higher power conversion efficiencies and a significant reduction of the unwanted spontaneous emission.

The placement of the gain region(s) is determined by using the standard matrix method of optics; see Corzine et al., Design of Fabry-Perot Surface-Emitting Lasers with a Periodic Gain Structure, IEEE Journal of Quantum Electronics, Vol. 25, No. 6, June 1989, pp. 1513–1524. To get good results, the thicknesses of the periodic gain layer(s) 305 need to be at or below 50 nm in order to avoid unwanted spontaneous emission.

The laser can be increased in area while maintaining a degree of spatial coherence by utilizing the phase locked organic laser array 220 as depicted in FIG. 11. To form a two-dimensional phase locked laser array 220, lasing elements 200 separated by inter element regions 210 need to be defined on the surface of the organic laser 24. To obtain phase locking, intensity and phase information must be exchanged amongst the lasing elements 200. This is best obtained by weakly confining the laser emissions to the lasing regions by either small amounts of built in index or gain guiding, e.g. by modulating the reflectance of one of the mirrors.

In the embodiment shown in FIG. 11, the reflectance modulation is affected by patterning and forming an etched region in the bottom dielectric stack, using standard photolithographic and etching techniques, thus forming a two dimensional array of lasing elements 200 in the form of circular pillars on the surface of the bottom dielectric stack. The remainder of the organic laser micro cavity structure is deposited upon the patterned bottom dielectric stack as described above. In this embodiment the shape of the lasing elements 200 is circular; however, other shapes are possible, such as rectangular. The inter-element spacing 210 is in the range of 0.25 to 4 µm.

Phase locked array operation will also occur for larger inter region spacings; however, larger spacings lead to inefficient usage of the optical pumping energy. The etch depth is preferred to be from 200 to 1000 nm deep. By etching just beyond an odd number of layers into the bottom dielectric stack, it is possible to effect a significant shift of the longitudinal mode wavelength in the etched region away from the peak of the gain media. Hence, lasing action is prevented and spontaneous emission is significantly reduced in the area between the lasing elements 200. The end result of the formation of etched region is that the laser emission is weakly confined to the lasing elements 200, no lasing originates from the area between the regions, and coherent phase locked laser light is emitted by the array 220.

The invention has been described in detail with particular reference to certain preferred embodiments thereof, but it will be understood that variations and modifications can be effected within the spirit and scope of the invention.

PARTS LIST 10 substrate
12 encapsulating cover
14 OLED display
16 emitted light
20 OLED laser light emitter
22 OLED
24 organic laser
26 light sensor
28 optics
30 controller
32 enclosure
34 light pipe
100 electrode
102 transport layer
104 emissive layer
106 transport layer
108 electrode layer
110 transparent planarization layer
112 mirror
114 active layer
116 mirror
120 incoherent light
122 laser light
200 laser element
210 inter element spacing
220 laser array 305 periodic gain layer
310 spacer layer
320 standing wave pattern

What is claimed is:

1. An OLED display and touch screen system, comprising:
   a) a substrate;
   b) an OLED display including an array of individually addressable OLEDs formed on the substrate; and
   c) a touch screen including an OLED laser light emitter formed on the substrate, a light sensor formed on the substrate across the display from the light emitter, and optics located around the display above the light emitter and the light sensor for directing light emitted from the OLED laser light emitter across the display to the light sensor, wherein the OLED laser light emitter includes an OLED that emits incoherent light and an organic laser positioned to be optically pumped by the OLED that emits incoherent light.

2. The OLED display and touch screen claimed in claim 1, wherein the OLED laser light emitter is a linear array of individually addressable OLED laser light emitters and the light sensor is a linear array of light detecting elements.

3. The OLED display and touch screen claimed in claim 2, wherein the OLED laser light emitters and the light detecting elements are interdigitated in a plurality of linear arrays surrounding the OLED display.

4. The OLED display and touch screen claimed in claim 2, further comprising control electronics for sequentially activating the OLED laser light emitters.

5. The OLED display and touch screen claimed in claim 2, further comprising control electronics for simultaneously activating the OLED laser light emitters.

6. The OLED display and touch screen claimed in claim 1, wherein the OLED laser light emitter is a linear emitter and the light sensor is a linear array of light detecting elements.

7. The OLED display and touch screen claimed in claim 1, wherein the OLED display is a top emitting display.

8. The OLED display and touch screen claimed in claim 1, wherein the OLED display is a bottom emitting display.

9. The OLED display and touch screen claimed in claim 1, wherein the OLED laser light emitter emits infrared light.

10. The OLED display and touch screen claimed in claim 1, wherein the optics are 45 degree mirrors.

11. The OLED display and touch screen claimed in claim 10, further comprising a frame surrounding the OLED display, and wherein the 45 degree mirrors are supported by the frame.

12. The OLED display and touch screen claimed in claim 1, further comprising a frame surrounding the OLED display, and wherein the optics are supported by the frame.

13. The OLED display and touch screen claimed in claim 12, including an enclosure for the display wherein the frame is a portion of the enclosure.

14. The OLED display and touch screen claimed in claim 1, wherein the optics comprise light pipes.

15. The OLED display and touch screen claimed in claim 1, further comprising an integrated controller for controlling both the OLED display and the touch screen.

16. The OLED display and touch screen claimed in claim 15, wherein the integrated controller is formed on the substrate.

17. The OLED display and touch screen claimed in claim 1, wherein the light sensor is a non-organic light detecting element.

18. The OLED display and touch screen claimed in claim 17, wherein the non-organic light detecting element is a silicon light detecting element.

19. The OLED display and touch screen claimed in claim 17, wherein the non-organic light detecting element is a thin film device.

20. The OLED display and touch screen claimed in claim 1, wherein the light sensor is an organic light sensor.

21. An OLED display and touch screen system, comprising:
   a) a substrate;
   b) an OLED display including an array of individually addressable OLEDs formed on the substrate; and
   c) a touch screen including an OLED laser light emitter formed on the substrate, a light sensor formed on the substrate across the display from the light emitter, and optics located around the display above the light emitter and the light sensor for directing light emitted from the OLED laser light emitter across the display to the light sensor, wherein the OLED laser light emitter includes an OLED that emits incoherent light and an organic laser positioned to be optically pumped by the OLED that emits incoherent light;
   further comprising control electronics for activating the OLED laser light emitter in a predetermined temporal pattern and for filtering an output from the light sensor to detect the predetermined pattern.

* * * * *